June 30, 1970 N. P. CERNIGLIA ET AL 3,518,135

METHOD FOR PRODUCING PATTERNS OF CONDUCTIVE LEADS

Filed Jan. 30, 1967 4 Sheets-Sheet 1

INVENTORS.
NINO P. CERNIGLIA,
JACOB S. CRYTZER
and RICHARD C. TONNER

BY David M Keay

AGENT.

INVENTORS.
NINO P. CERNIGLIA,
JACOB S. CRYTZER
and RICHARD C. TONNER

BY David M. Keay

AGENT.

June 30, 1970 N. P. CERNIGLIA ET AL 3,518,135

METHOD FOR PRODUCING PATTERNS OF CONDUCTIVE LEADS

Filed Jan. 30, 1967 4 Sheets-Sheet 3

INVENTORS.
NINO P. CERNIGLIA,
JACOB S. CRYTZER
and RICHARD C. TONNER

BY David M. Keay

AGENT.

METHOD FOR PRODUCING PATTERNS OF CONDUCTIVE LEADS

INVENTORS.
NINO P. CERNIGLIA,
JACOB S. CRYTZER
and RICHARD C. TONNER

BY David M. Keay

AGENT.

3,518,135

METHOD FOR PRODUCING PATTERNS OF CONDUCTIVE LEADS

Nino P. Cerniglia, Revere, Jacob S. Crytzer, Hingham, and Richard C. Tonner, Braintree, Mass., assignors to Sylvania Electric Products Inc., a corporation of Delaware Filed Jan. 30, 1967, Ser. No. 612,636
Int. Cl. H01l *7/50;* C23f *1/00*
U.S. Cl. 156—17 5 Claims

ABSTRACT OF THE DISCLOSURE

Method of forming two layers of conductive leads on the upper surface of a semiconductor device in which the two layers of leads are separated by a layer of silicon oxide or a related material. After the leads of the first layer have been formed and a layer of silicon oxide has been deposited on the leads, but before the leads of the second layer are formed, openings to permit interconnections between the two layers of leads are etched in the silicon oxide layer by an etching solution of hydrofluoric acid, ammonium fluoride, and an alcohol.

BACKGROUND OF THE INVENTION

This invention relates to forming conductive leads on substrates. More particularly, it is concerned with methods of producing semiconductor devices having a pattern of two or more layers of interconnected conductive leads integral therewith.

Monolithic integrated circuit networks are semiconductor devices which contain several electrical components fabricated within a single block of semiconductor material. Typically, these devices are produced by well-known techniques of selectively diffusing conductivity type imparting materials into a wafer of semiconductor material through openings in an adherent protective coating of silicon oxide. Electrical interconnections between the components are provided by thin strips of metal, typically aluminum, which adhere to the protective oxide coating overlying the surface of the semiconductor wafer and which make contact to the components at openings in the protective coating. Since these interconnecting leads lie essentially in a single plane, the interconnection pattern is subject to limitations. Various arrangements which permit cross-overs of separate conductive paths have been developed. However, complex integrated circuit networks require a greater number of conductive paths and cross-overs than readily can be accommodated in a single plane on the surface of the wafer containing the circuit components.

In order to provide the interconnection pattern for a complex integrated circuit network, two or more sets, or layers, of conductive leads each in a plane and separated by an intervening non-conductive layer may be fabricated on the oxide coating of the semiconductor wafer. Necessary contacts between the leads of each set are obtained at openings in the intervening non-conductive layer. By employing well-established techniques of material deposition, photo-resist masking and etching, the conductive leads of the first layer are formed on the protective oxide coating in contact with the underlying semiconductor material at openings in the coating. Similarly, a layer of a non-conductive material is placed on the first layer of conductive leads and openings are formed in the layer of non-conductive material to expose the leads of the first layer at points which are to be in contact with leads of the second layer. Then, the leads of the second layer are formed on the layer of non-conductive material in contact with the leads of the first layer at the openings in the layer of non-conductive material.

In order to avoid problems introduced by employing additional materials, it is desirable to employ the same conductive material for both layers of conductive leads and the same non-conductive material for the protective coating on the surface of the semiconductor wafer and for the non-conductive layer between the two sets of leads. Aluminum and silicon oxide are the preferred materials by virtue of their physical and chemical properties and the knowledge accumulated by their use in the semiconductor art. However, the etching materials commonly employed for etching silicon oxide and related materials in order to form openings attack aluminum in an uncontrollable manner. Thus, if silicon oxide is used as the intervening layer of non-conductive material between the two sets of conductive leads and these etching materials are employed to produce openings so as to uncover contact regions of the first set of leads, the portions of the leads which become exposed to the etching solution will be dissolved. In order to avoid use of these etching materials after the first set of leads have been formed, different non-conductive materials, for example, organic materials, which can be etched by materials which do not attack the underlying metal have been employed as the intervening non-conductive layer. However, these non-conductive materials do not have the desirable physical and chemical properties of silicon oxide and related materials.

SUMMARY OF THE INVENTION

In the method of producing a pattern of conductive leads according to the invention a substrate is provided. The substrate may be a body of semiconductor material having a surface coated with an adherent non-conductive coating with openings through the coating for permitting contact to be made to underlying surface areas of the body. Conductive material is placed on predetermined portions of the surface of the substrate forming the first set, or layer, of conductive leads. The surface of the conductive material and the adjacent uncovered surface of the substrate are then coated with a layer of non-conductive material selected from the group consisting of silicon oxide and silica glasses. Protective material is placed on the surface of predetermined portions of the layer of non-conductive material leaving exposed other portions of the layer of non-conductive material. These exposed portions overlie the predetermined portions of the conductive material at which it is desired to make contact between the first and second sets of conductive leads. Next, the assembly is subjected to an etching solution of hydrofluoric acid, ammonium fluoride, and a water-soluble alcohol for a time sufficient to remove the non-conductive material of the layer at the exposed portions and expose the underlying predetermined portions of the conductive material. This etching solution dissolves the non-conductive material and produces openings through the layer of non-conductive material, but does not attack the underlying conductive material as it becomes exposed to the etching solution. Conductive material providing the second set of conductive leads which interconnect with the first set of leads at the openings in the layer of non-conductive material may then be placed on the surface of the non-conductive layer.

BRIEF DESCRIPTION OF THE DRAWINGS

Various objects, features, and advantages of the method of the invention will be apparent from the following detailed description and the accompanying drawings wherein.

DETAILED DESCRIPTION OF THE INVENTION

Figure 1:
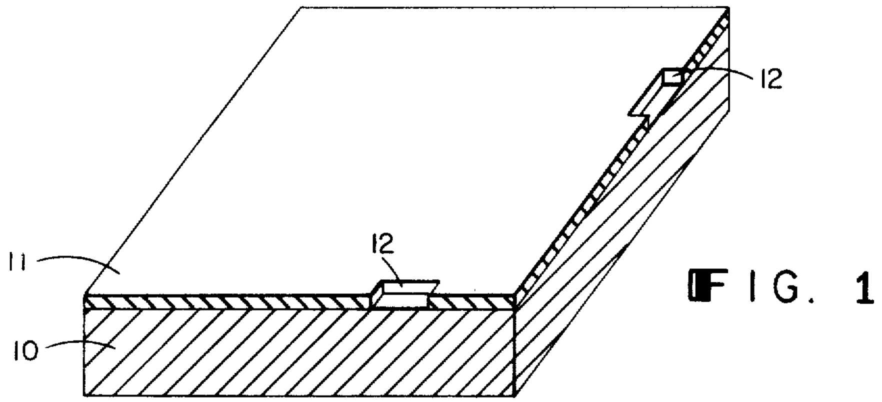
FIGS. 1 through 8 are perspective views in cross-section illustrating a fragment of a wafer of semiconductor material at various stages during the fabrication of a semiconductor device according to the method of the invention.

FIG. 1 illustrates a fragment of a substrate 10 which is a wafer of semiconductor material, for example silicon, having a plurality of regions of different conductivity type formed by diffusion to provide the components of an integrated circuit network. The flat, upper major surface of the wafer is coated with a layer 11 of an adherent protective material, usually silicon oxide. Openings 12 in the oxide layer expose underlying surface areas of the silicon to which electrical connections are to be made. These openings may be formed by employing the well-known photo-resist masking and chemical etching techniques utilized extensively in the semiconductor art.

Figure 2:
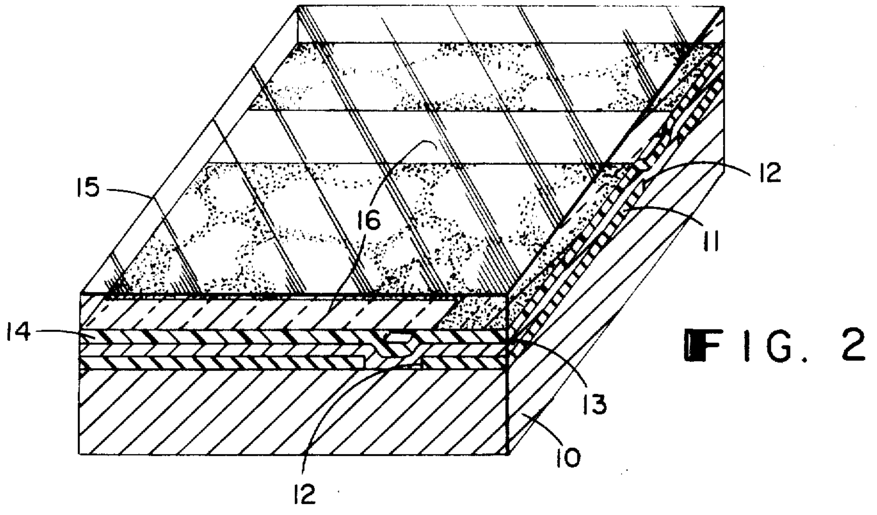

In practicing the method of the invention, a layer 13 of conductive materal, for example aluminum, approximately 5,000 to 10,000 angstrom units thick, is deposited on the upper surface of the substrate includng both the surface of the slicon oxide layer and the exposed surface of the silicon wafer at the openngs 12, as shown in FIG. 2. Although aluminum is preferred as the conductive material other metals, for example, titanium, chromium, tungsten, molybdenum, and zirconium, which form refractory oxides may be used. The conductive layer may be deposited on the substrate as by known vacuum deposition techniques, or by sputtering.

A layer 14 of a photosensitive resistant material of the type employed in known masking and etching techniques for forming openings in silicon oxide is placed over the surface of the aluminum layer 13. Any of the well-known photosensitive polymerizable resistant materials known in the art may be employed. The resist material is applied as by spinning on, or by spraying.

The layer of resistant material is dried and then selectively exposed to ultraviolet light through a mask 15. The mask is of a transparent material, typically glass, and portions of one surface are rendered opaque in a particular predetermined pattern. In the procedure as described the photosensitive resistant material is a negative type and the pattern of transparent regions 16 conforms to the pattern of the first set of conductive leads to be produced. If the photosensitive resistant material used were a positive type, the opaque portions would be arranged to conform to the desired lead pattern. The mask is fabricated by employing known photolithographic techniques which enable the opaque areas and the transparent regions between them to be defined with a high degree of precision.

The mask is properly aligned with the silicon wafer by observation of the pattern of depressions in the surface of the resistant material caused by the underlying openings 12 in the silicon oxide. The masked wafer is subjected to ultraviolet light polymerizing the portions of the resistant material underlying the transparent regions of the mask. Then the mask is removed, and the wafer is rinsed in a suitable developing solution which washes away the portions of the resistant material which were under the opaque regions of the mask and thus not exposed to the ultraviolet light. The assembly may then be baked to further polymerize and harden the resistant material.

Then, the assembly is treated to remove the portions of the aluminum layer not protected by the resistant material 14. The wafer is immersed in an aqueous etching solution of approximately 10 percent sodium hydroxide by weight, or an aqueous etching solution of 95 percent reagent grade phosphoric acid by weight an 5 percent reagent grade nitric acid by weight. These etching solutions dissolve aluminum but do not attack other materials of the assembly.

Figure 3:
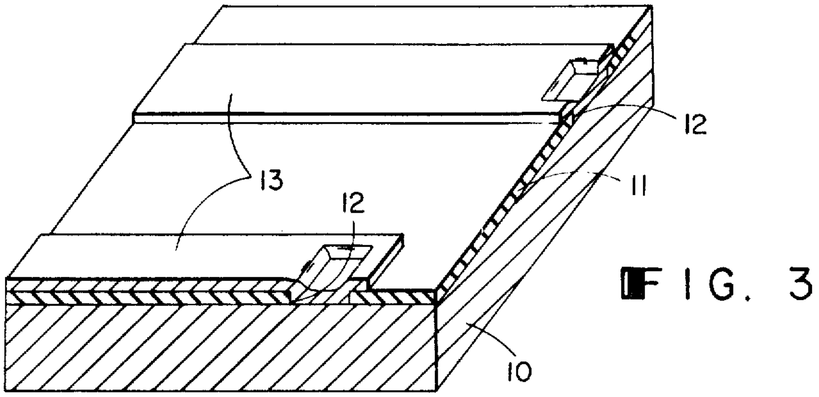

Following the etching treatment and rinsing of the assembly, the resistant material is removed by dissolving in a suitable solvent. As can be seen in FIG. 3 the aluminum layer 13 remains over certain predetermined portions of the oxide layer 11 and in the openings 12 where it contacts the underlying regions of the silicon wafer. This remainder of the aluminum layer 13 constitutes the first set, or layer, of conductive leads.

Figure 4:
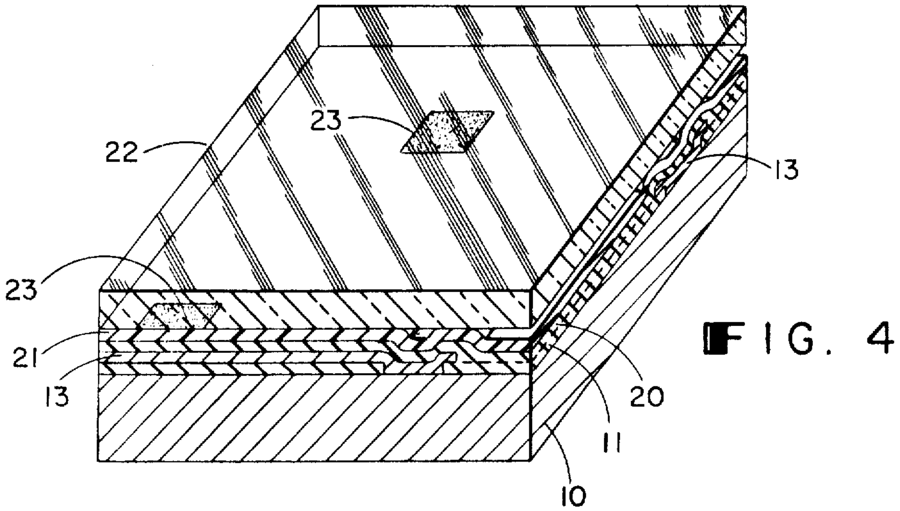

Next, as illustrated in FIG. 4 the assembly is coated with a layer 20 of silicon oxide (silica) or a silica glass. The particular material employed should be compatible with, or the same as, the non-conductive material at the substrate surface. Silicon oxide may be deposited on the surface by the known technique of reacting $SiH_4$ with oxygen at the surface. A layer of from 5,000 to 10,000 angstrom units thickness of silicon oxide is deposited.

Figure 5:
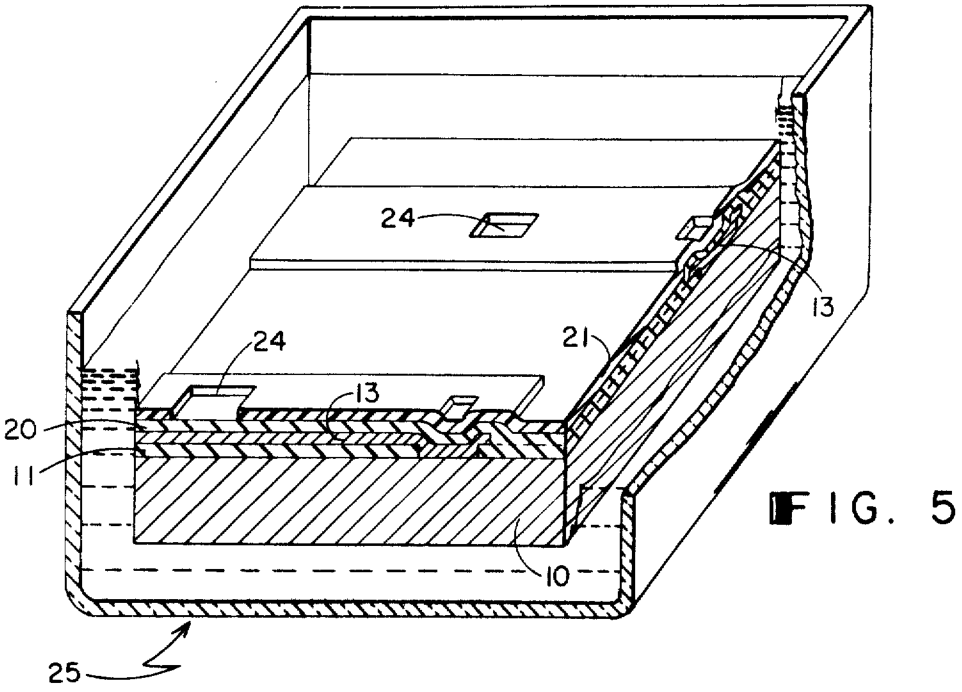

A photosensitive resistant material 21 which may be of the same type as that previously employed is placed on the surface of the silicon oxide layer 20. A mask having opaque regions 23 arranged to overlie the portions of the remainder of the aluminum layer 13 at which it is desired to establish contact between the first and second sets of conductive leads is placed over the photosensitive resistant coating. The masked wafer is subjected to ultraviolet light polymerizing the photosensitive material underlying the transparent regions of the mask 22. The mask is removed and the assembly is rinsed in a developing solution to wash away the resistant material which was not exposed to light. The resulting assembly having openings 24 in the protective resistant coating 21 which expose portions of the silicon oxide layer 20 overlying the areas of the first set of leads to be contacted by the second set is shown in FIG. 5.

Next, the assembly is immersed in a bath 25 containing an etching solution of hydrofluoric acid, ammonium fluoride, and a water-soluble alcohol for a period of time sufficient to etch through the silicon oxide 20 exposed at the openings 24 in the protective coating 21 and expose the underlying portions of the first set of aluminum leads.

The etching solution may be prepared by combining known mixtures of aqueous solutions of hydrofluoric acid and ammonium fluoride commonly used in etching silicon oxide with an alcohol. Suitable alcohols are those which are water soluble, and may be alcohols of the monohydric and polyhydric types. Thus, examples of suitable alcohols which may be employed are the lower molecular weight mononhydric normal and branched chain alcohols such as methyl, ethyl, propyl, isopropyl, butyl and isobutyl alcohols, and polyhydric alcohols such as ethylene glycol, diethylene glycol and glycerin. The alcohol may constitute from 25 to 75 percent by volume of the etching solution. The mixture of hydrofluoric acid and ammonium fluoride solutions may be prepared by mixing standard 48 percent by weight hydrogen fluoride and 40 percent by weight ammonium fluoride aqueous solution. One standard mixture employs 1 part by weight of 48 percent hydrogen fluoride solution and 9 parts by weight of 40 percent ammonium fluoride solution. However, the two solutions may be mixed in different ratios so that hydrogen fluoride is present in a range of from about 2.5 to 19 percent by weight of the mixture and ammonium fluoride is present in a range of from about 24 to 38 percent by weight of the mixture. The foregoing etching solutions dissolve the exposed silicon oxide but do not significantly attack the underlying aluminum.

Figure 6:
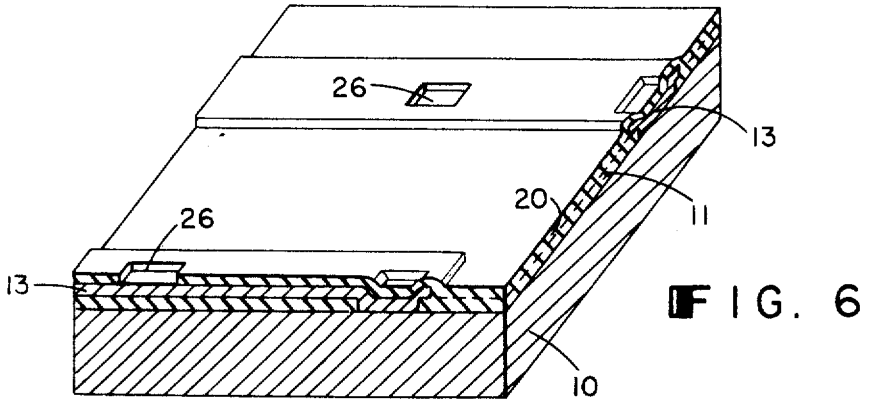

After the assembly has been treated in the etching solution, the protective resistant material is removed by dissolving in a suitable solvent. The resulting assembly is illustrated in FIG. 6. As can be seen in FIG. 6, the layer of silicon oxide 20 overlies the first layer of silicon oxide 11 and the conductive leads 13 of the first set except at openings 26 which expose those portions of the first set of leads at which it is desired that the second set of conducting leads make electrical contact.

Figure 7:
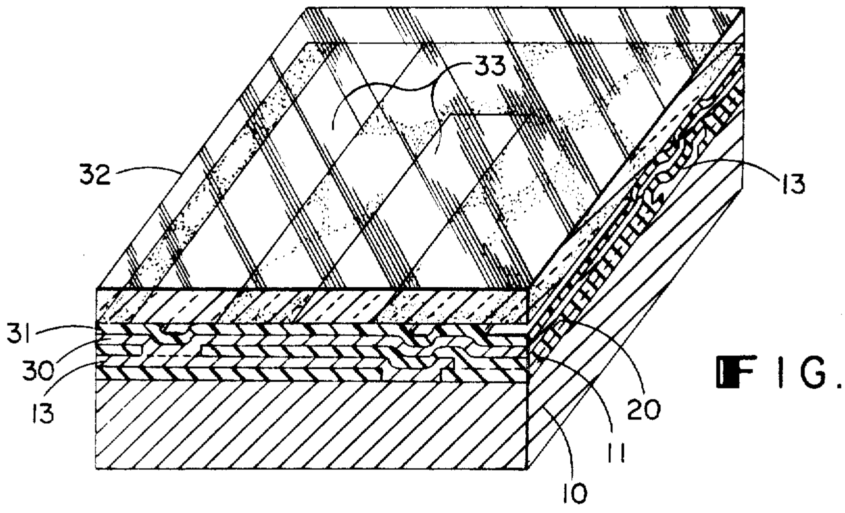

Next, the conductive leads of the second set are formed on the surface of the layer of silicon oxide 20 so as to make connections to the first set of leads at the openings 26 in the oxide layer 20. A layer of aluminum 30 of from 5,000 to 20,000 angstrom units thick is deposited on the surface of the silicon oxide layer 20 and on the exposed surface area of the first set of conductive leads 13 as illustrated in FIG. 7. A layer 31 of a photosensitive resistant material which may be of the same type as that previously employed is deposited on the surface of the aluminum layer 30. A mask 32 having opaque and transparent 33 regions is positioned over the photosensitive resistant material. The transparent regions 33 of the mask 32 delineate the pattern of the second set of conductive leads.

The masked wafer is subjected to ultraviolet light polymerizing the photosensitive resistant material underlying the transparent regions of the mask 32. The mask is removed and the assembly is rinsed in a developing solution to wash away the resistant material which was not exposed to light.

Figure 8:
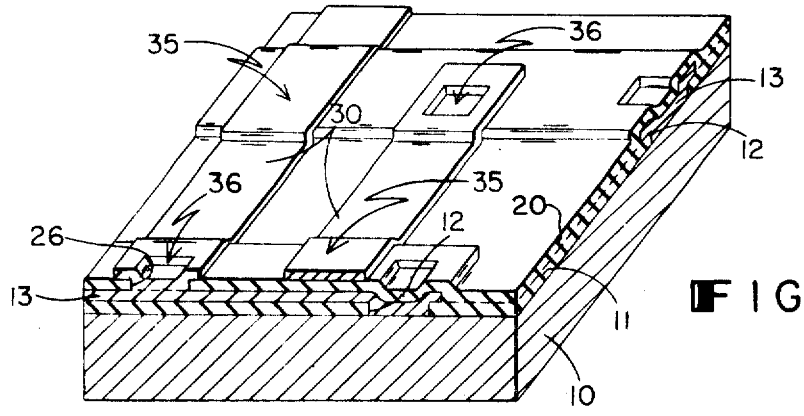

The exposed aluminum is then etched away as by spraying the assembly for a period of about 2 minutes with an aqueous solution of sodium hydroxide, or an aqueous solution of phosphoric and nitric acids as employed previously. The etching solution dissolves aluminum but does not attack the resistant material or the silicon oxide. Thus, the exposed aluminum is removed, while the portions of the second aluminum layer covered by the overlying protective material 31 are not disturbed. The protective material is then dissolved by rinsing in a suitable solvent to provide the resulting assembly as illustrated in FIG. 8. The assembly is then heated to cause alloying of the aluminum in the openings 12 in the first coating 11 of silicon oxide with the underlying silicon thereby forming ohmic contacts between the regions of the silicon wafer and the conductive leads.

As can be seen from FIG. 8, the pattern of conductive leads of a semiconductor device may be formed in sets, or layers, with cross-overs 35 or interconnections 36 between the sets provided as desired by the absence or presents of openings 26 in the intervening layer 20 of non-conductive material. Since the material of the intervening non-conductive layer 20 is the same as, or closely related to, the protective coating 11 over the silicon, there is excellent physical and chemical compatibility between the various materials of the device. That is, good adhesion is obtained between the two non-conductive layers, and the intervening non-conductive layer does not contain material which might cause contamination of the device. In addition, the material of the intervening layer is stable at extremely high temperatures.

In a typical example in accordance with the invention a layer 13 of aluminum 5,000 angstrom units thick was deposited on a silicon oxide coating 11 and in openings 12 in the coating exposing surface areas of a wafer 10 of silicon. The first set of conductive leads was formed from the aluminum layer by the photosensitive resist masking and chemical etching procedures described above. Then, a layer 20 of silicon oxide approximately 7,200 angstrom units thick was deposited on the wafer by reacting $SiH_4$ with oxygen at the surface of the wafer. Protective masking material 21 was placed on the surface of predetermined portions of the oxide layer 20 by known techniques as described.

Next, the assembly was subjected to an etching solution of hydrofluoric acid, ammonium flouride, and a water-soluble alcohol. The etching solution included a mixture of aqueous solutions of ammonium fluoride and hydrogen fluoride combined with methyl alcohol. The mixture consisted essentially of 9 parts by weight of a 40 percent by weight ammonium fluoride aqueous solution and 1 part by weight of a 48 percent by weight hydrogen fluoride aqueous solution. This mixture was combined with an equal volume of methyl alcohol to produce the etching solution employed. This etching solution etched through the silicon oxide layer 20 in approximately 4 minutes, or at an etching rate of about 1800 angstrom units per minute. The etching solution did not attack the aluminum other than to perform a slight cleaning action.

After the assembly was treated in the etching solution, a layer 30 of aluminum 10,000 angstrom units thick was deposited on the surface of the silicon oxide layer 20 and on the portion of the first set of leads 13 exposed at the openings 26 in the silicon oxide layer. The second set of conductive leads was formed from the aluminum layer by the photosensitive resist masking and chemical etching procedures previously described. After formation of the leads, and removal of the protective material, the assembly was heated to alloy the aluminum to the silicon at the openings 12 in the first oxide coating 11.

The method of the invention has also been carried out by employing the above-mentioned mixture of ammonium fluoride and hydrogen fluoride in combination with other water-soluble alcohols in different proportions to etch openings in silicon oxide layers. The following table shows the etching rate of various solutions on silicon oxide.

| Percent by Volume of Mixture of 1 Part by Weight of 48 Percent by Weight Hydrogen Fluoride Aqueous solution and 9 Parts by Weight of 40 Percent by Weight Ammonium Fluoride Aqueous Solution | Alcohol | Percent by Volume of Alcohol | Etching Rate on Silicon Oxide, in Angstrom Units per Minute |
|---|---|---|---|
| 75 | Methyl alcohol | 25 | 2,060 |
| 25 | do | 75 | 1,800 |
| 75 | Isopropyl alcohol | 25 | 1,920 |
| 50 | do | 50 | 1,800 |
| 25 | do | 75 | 1,700 |
| 75 | Ethyl alcohol | 25 | 2,200 |
| 50 | do | 50 | 1,975 |
| 25 | do | 75 | 1,360 |
| 75 | n-Butyl alcohol | 25 | 2,480 |
| 50 | do | 50 | 2,320 |
| 25 | do | 75 | 1,800 |
| 75 | Ethylene glycol | 25 | 2,200 |
| 50 | do | 50 | 1,230 |
| 25 | do | 75 | 990 |

The etching solutions as described have also been employed in carrying out the method of the invention when silica glasses have been used as the non-conductive material between the two sets of conductive leads. For example, the following table shows the etching rate of various solutions on alumina-boro-silicate glass.

| Percent by Volume of Mixture of 1 Part by Weight of 48 Percent by Weight Hydrogen Fluoride Aqueous Solution and 9 Parts by Weight of 40 Percent by Weight Ammonium Fluoride Aqueous Solution | Alcohol | Percent by Volume of Alcohol | Etching Rate on Alumina-Boro-Silicate Glass, in Angstrom Units per Minute |
|---|---|---|---|
| 25 | Isopropyl alcohol | 75 | 320 |
| 50 | n-Butyl alcohol | 50 | 820 |
| 50 | Ethylene glycol | 50 | 420 |

It has been found that the foregoing solutions each silicon oxide and silica glasess without significantly attacking aluminum. Apparently the presence of the alcohol in the solution reduces the proportion of water so that the solution does not effectively oxidize aluminum. Since the formation of oxides is the first of several reactions which must occur in order to remove the metal, the metal is substantially unaffected by the solution. Similarly, these etching solutions do not attack other metals which oxidize to form refractory oxides.

It has also been found that these solutions having a significant alcohol content show no shift in the concentration of fluoride ions during the etching process. Thus, the etching rate remains fairly constant; and, therefore, more controllable. This result is believed to be caused by the polarizing action of the alcohol which action appears to be very similar to that obtained from aqueous solutions. Of the alcohols specifically mentioned thereinabove, methyl alcohol is particularly effective in this respect.

While there has been shown and described what are considered preferred embodiments of the invention, it will be obvious to those skilled in the art that various changes and modifications may be made therein without departing from the invention as defined in the appended claims.

What is claimed is:

1. The method of producing semiconductor devices including the steps of providing a body of semiconductor material having a surface coated with an adherent non-conductive coating of silicon dioxide having openings therein for permitting contact to underlying surface areas of said body;

placing aluminum on predetermined portions of the surface of the non-conductive coating and in said openings;

coating the surface of the aluminum and the uncovered surface of the non-conductive coating with a layer of a non-conductive material selected from the group consisting of silicon oxide and silica glasses;

placing protective material on the surface of predetermined portions of the layer of non-conductive material leaving exposed other portions of said layer overlying predetermined portions of the aluminum; and subjecting the assembly to an etching solution consisting of a mixture of aqueous solutions of hydrofluoric acid and ammonium fluoride in which hydrogen fluoride is present in a range of from about 2.5 to 19 percent by weight of the mixture and ammonium fluoride is present in a range of from about 24 to 38 percent by weight of the mixture and a water-soluble alcohol constituting from 25 to 75 percent by volume of the etching solution for a time sufficient to remove the non-conductive material of the layer at the exposed portions and expose the underlying predetermined portions of the aluminum.

2. The method of producing semiconductor devices in accordance with claim 1 wherein said alcohol is a water-soluble monohydric alcohol.

3. The method of producing semiconductor devices including the steps of providing a body of semiconductor material having a surface coated with an adherent non-conductive coating having openings therein for permitting contact to underlying surface areas of said body;

placing aluminum on predetermined portions of the surface of the non-conductive coating and in said openings;

coating the surface of the alminum and the uncovered surface of the nonconductive coating with a layer of silicon oxide;

placing protective material on the surface of predetermined portions of the layer of silicon oxide leaving exposed other portions of said layer overlying predetermined portions of the aluminum; and subjecting the assembly to an etching solution in which the proportions of ingredients in the etching solution are those produced by 3 volumes of a mixture of 1 part by weight of a 48 percent by weight hydrogen fluoride aqueous solution and 9 parts by weight of a 40 percent by weight ammonium fluoride aqueous solution and from 1 to 9 volumes of a water-soluble monohydric alcohol for a time sufficient to remove the silicon oxide at the exposed portions and expose the underlying predetermined portions of the aluminum.

4. The method of producing semiconductor devices including the steps of providing a body of semiconductor material having a surface coated with an adherent coating of silicon oxide having openings therein for permitting contact to underlying surface areas of said body;

applying a first layer of aluminum to the surface of the coating of silicon oxide and to the surface areas of said body exposed at said openings;

placing photosensitive resistant material on the surface of predetermined portions of the first layer of aluminum including the portions overlying said openings;

subjecting the assembly to etching material capable of dissolving aluminum but not silicon oxide or the photosensitive resistant material to remove the first layer of aluminum except for the predetermined portions covered by the photosensitive resistant material; removing the photosensitive resistant material;

removing the photosensitive resistant material;

coating the surface of the remainder of the first layer of aluminum and the uncovered portions of the surface of the coating of silicon oxide with a layer of silicon oxide;

placing photosensitive resistant material on the surface of predetermined portions of the layer of silicon oxide leaving exposed other portions of the layer of silicon oxide overlying predetermined portions of the remainder of the first layer of aluminum;

subjecting the assembly to an etching solution wherein the proportions of ingredients in the solution are those produced by 3 volumes of a mixture of 1 part by weight of a 48 percent by weight hydrogen fluoride aqueous solution and 9 parts by weight of a 40 percent by weight ammonium fluoride aqueous solution and from 1 to 9 volumes of a water-soluble monohydric alcohol for a time sufficient to remove the silicon oxide at the exposed portions and expose the underlying predetermined portions of the remainder of the first layer of aluminum;

removing the photosensitive resistant material;

applying a second layer of aluminum to the surface of the layer of silicon oxide and to the exposed predetermined portions of the remainder of the first layer of aluminum;

placing photosensitive resistant material on the surface of predetermined portions of the second layer of aluminum including the portions overlying the last-mentioned predetermined portions of the remainder of the first layer of aluminum;

subjecting the assembly to etching material capable of dissolving aluminum but not silicon oxide or the photosensitive resistant material to remove the second layer of aluminum except for the predetermined portions covered by the photosensitive resistant material; and removing the photosensitive resistant material.

5. The method of producing semiconductor devices in accordance with claim 4 wherein said alcohol is methyl alcohol and constitutes 50 percent by volume of the etching solution.

References Cited

UNITED STATES PATENTS

| | | | |
|---|---|---|---|
| 2,278,257 | 3/1942 | Gallagher | 272—79.3 |
| 3,122,817 | 3/1964 | Andrus | 29—25.3 |
| 3,193,418 | 7/1965 | Cooper et al. | 148—189 |
| 3,421,985 | 1/1969 | Baker et al. | 204—15 |

JACOB H. STEINBERG, Primary Examiner

U.S. Cl. X.R.

156—11; 148—189; 252—79.3

PO-1050
(5/69)

UNITED STATES PATENT OFFICE
CERTIFICATE OF CORRECTION

Patent No. 3,518,135 Dated June 30, 1970

Inventor(s) Nino P. Cerniglia, Jacob S. Crytzer, and Richard C. Tonne

It is certified that error appears in the above-identified patent and that said Letters Patent are hereby corrected as shown below:

Column 3, line 19, "includng" should be--including--

Column 6, line 56, "each" should be--etch--

Claim 4, column 8, line 18 "removing the photosensitive resistant material" should be deleted.

SIGNED AND SEALED
NOV 10 1970

(SEAL)
Attest:

Edward M. Fletcher, Jr.
Attesting Officer

WILLIAM E. SCHUYLER, JR.
Commissioner of Patents